(12) United States Patent
Dale et al.

(10) Patent No.: US 7,474,124 B2
(45) Date of Patent: Jan. 6, 2009

(54) ELECTRONIC CIRCUIT FOR MAINTAINING AND CONTROLLING DATA BUS STATE

(75) Inventors: Bret R. Dale, Jericho, VT (US); Darin J. Daudelin, Williston, VT (US); Todd M. Fisher, Essex Junction, VT (US); Douglas W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/684,890

(22) Filed: Mar. 12, 2007

(65) Prior Publication Data

US 2008/0224733 A1 Sep. 18, 2008

(51) Int. Cl.
*H03K 17/16* (2006.01)

(52) U.S. Cl. .......................................... 326/82; 326/30

(58) Field of Classification Search .............. 326/30
See application file for complete search history.

(56) References Cited

U.S. PATENT DOCUMENTS 5,532,630 A * 7/1996 Waggoner et al. ........... 327/108
6,175,253 B1 * 1/2001 Maiyuran et al. ............. 326/86
6,484,267 B1 * 11/2002 Lee et al. ..................... 713/600

* cited by examiner

*Primary Examiner*—Rexford Barnie
*Assistant Examiner*—Thienvu V Tran
(74) *Attorney, Agent, or Firm*—Scully, Scott, Murphy & Presser, P.C.; Riyon Harding

(57) ABSTRACT

The inventions herein are directed to an inventive bus keeper and logic circuit for use with an I/O circuit, for example, for use on the receiver side of the I/O buffer circuit. The inventive circuit connects one data line of an IC function to one line of a tri-state bus (one bit of data per bus line or wire). The bus keeper and logic control circuit is maintained in isolation from I/O functional driver and is responsive to a tri-state signal (TS), normally provided by the IC or SOC, or the I/O circuit during normal I/O receiver side operation. The inventive bus keeper and logic circuit selectively enables any of a tri-state state, a pull-up state, pull-down state and bus keep mode state at the driver output pad in the presence of the tri-state enable signal, and is disabled when the I/O bus drive buffer circuit is in drive mode.

16 Claims, 3 Drawing Sheets

ELECTRONIC CIRCUIT FOR MAINTAINING AND CONTROLLING DATA BUS STATE

BACKGROUND OF THE INVENTION

1. Field of the Invention

The present invention relates to an I/O bus, and more particularly relates to a bus state keeper and logic control circuit to control I/O receiver-side bus operation by selectively including various resistive elements at the driver output or receiver input to keep the last logical state and prevent unwanted receiver switch when the bus is tri-stated.

2. Description of the Related Art

Conventional architectures for digital electronic systems, such as data processing systems, computers, control systems, communication systems, etc., communicate information (data) between integrated circuit components by way of buses. Buses are essentially transmission lines. For example, a bus may embody a transmission line configured as a metal line on a printed circuit board, or conductive metal or doped semiconductor line, or like conductive path in an integrated circuit (IC). For that matter, ICs include buses for communicating between on-chip circuit function, and very large scale ICs may now comprise system-on-chips (SOCs) that use internal buses to move data between system functions. Buses electrically connect the various circuit and system functions. To that end, the various circuit functions are designed to communicate with a bus, for example, on the receiver side of an I/O Buffer circuit for bus interaction, and so must have the ability to "drive" the bus. I/O data buses are driven to take temporary control of the bus for sending and receiving digital information. Digital information includes, but is not limited to digital data, address values, digital control signals, and the like.

In the case where multiple driver circuits are connected to the same bus, the bus control system must be controlled to prevent two or more drivers from simultaneously driving the bus. This can occur where disparate in-circuit or in-system drivers (for disparate circuit or system functions) that include complementary data states that extend for particular or different periods of time. Conflicting power states on a bus can result in excessive power dissipation, and may under certain conditions damage the driver circuits. For proper bus circuit operation, the circuit function drivers must present high impedance at driver outputs, or electrical connection to the physical bus line or node when tri-stated.

Buses and bus driver circuits operating in this fashion are referred to as tri-sate buses. Tri-state is a driver circuit state that occurs when the bus driver is turned off (tri-stated), where if not accommodated in some way, the bus electrically connected to the driver circuit may "float" to an unknown or indeterminate logical state. That is, without anything, for example, a fixed logical voltage state, to "hold" or "keep" the bus to a fixed logical state, the bus may "bounce" up and down (switch). Bounce can cause noise on the tri-stated bus, and under certain conditions, the noise could be misinterpreted as data at receiver-side data inputs, causing false and unnecessary receiver side switching. Erroneous switching can propagate erroneous data, and consume extra power during the unwanted switching event.

Pull-up and pull-down devices are known circuit elements added to bus control circuitry to facilitate "healthy" bus I/O data operation in view of possible "tri-state" limitations. The pull-up and pull-down devices are typically included in bus circuitry to ensure that all output drivers coupled to a bus line are in a high impedance state at tri-state switching, and before another driver takes the bus (to prevent floating). U.S. Pat. No. 5,532,630 (the '630 patent) is directed to CMOS half-latch devices that are incorporated in a receiver input of an I/O data bus interface. A drawback to the solution proposed by the '630 patent, however, is the way the complementary bus keeper devices are implemented in the receiver That is, the proposed solution requires that bus drivers attempting to assert bus control must overcome, or over-power the complementary bus keeper devices to change the data state of the bus. Utilizing control logic to prevent the keeper devices from being disabled during drive mode is understood to slow down the data transition time and burn extra power.

While attempts to minimize receiver switching problems at I/O driver tri-state switching are known, e.g., the '630 patent, no processes or circuits are known to prevent such undesirable tri-state bus events from occurring by holding the data bus to the last known value that was being driven onto the bus prior to the driver being tri-stated. In particular, no receiver circuitry is known to include a state keeping circuit that may be disabled when the driver is in drive mode by very weak pull-up and pull-down devices arranged to be readily overcome by driver operation if enabled during driver-controlled operation (e.g., receiving data from the bus).

SUMMARY OF THE INVENTION

To that end, an inventive bus keeper and logic circuit is disclosed and described as part of an I/O bus drive buffer circuit, for example on the receiver side of the I/O buffer circuit. The inventive circuit connects one data line of an IC function to one line of a tri-state bus (one bit of data per bus line or wire). The bus keeper and logic circuit is maintained in isolation from I/O functional driver and is responsive to a tri-state signal (TS). The IC or SOC typically provides TS, or the I/O bus drive buffer circuit during normal I/O receiver side operation. The inventive bus keeper and logic circuit selectively enables any of a tri-state state, a pull-up state, pull-down state and bus keep mode state at the driver output pad in the presence of the tri-state enable signal. The bus keeper and logic circuit is always disabled when the I/O bus drive buffer circuit is in drive mode, i.e., upon receipt of the functional driver's tri-state enable signal.

The bus keeper and logic control circuit may switch any combination of the very weak pull-up and pull-down devices into the node at the driver output connection to the bus. When the I/O driver is switched to its tri-state, pull-up (PU) and pull-down (PD) enable signals are used by the bus keeper and logic control circuit to control a set of four (4) transistors comprising the circuit. The set of keeper transistors maintain the driver output pad or node at various impedance states, which states are readily maintained or kept, and communicated to prevent unwanted receiver switching, particularly at driver tri-state. That is, the logic control uses the TS, PU and PD signals to maintain the receiver at its last known data state (without switching) when the driver goes into tri-state mode. The very weak pull-up and pull-down devices are chosen with values that ensure that the voltage state at the receiver is attained with small currents so in a case where a tri-stated driver is switched into drive mode, and the very weak pull-up or pull-down devices are operational in some combination at the driver output pad at switching, the driver transistors easily "overcome" the resistive devices due to there weaker character.

The advantages of an inventive bus system modeled in accord with the inventive bus keeper and logical circuit construction lie in the physical requirement that the circuit is maintained electrically separate from the driver circuitry to disable drive operation when tri-stated, without interrupting receive operation. The bus keeper and logic control circuit provides for improving overall tri-state bus system operation, wherein data transition times are not slowed or bogged down on the bus during receiver side operation. And such inventive system-bus operation reduces amounts of power consumed by bus use.

BRIEF DESCRIPTION OF THE DRAWINGS

The foregoing and other objects, aspects and advantages will be better understood from the following detailed description of embodiments of the inventions, with reference to the drawings, in which.

DETAILED DESCRIPTION OF THE PREFERRED EMBODIMENT(S) OF THE INVENTION

The inventive drawings and descriptions set forth herein are for exemplary purposes only, and are not meant to limit the scope and spirit of the invention.

Figure 1:
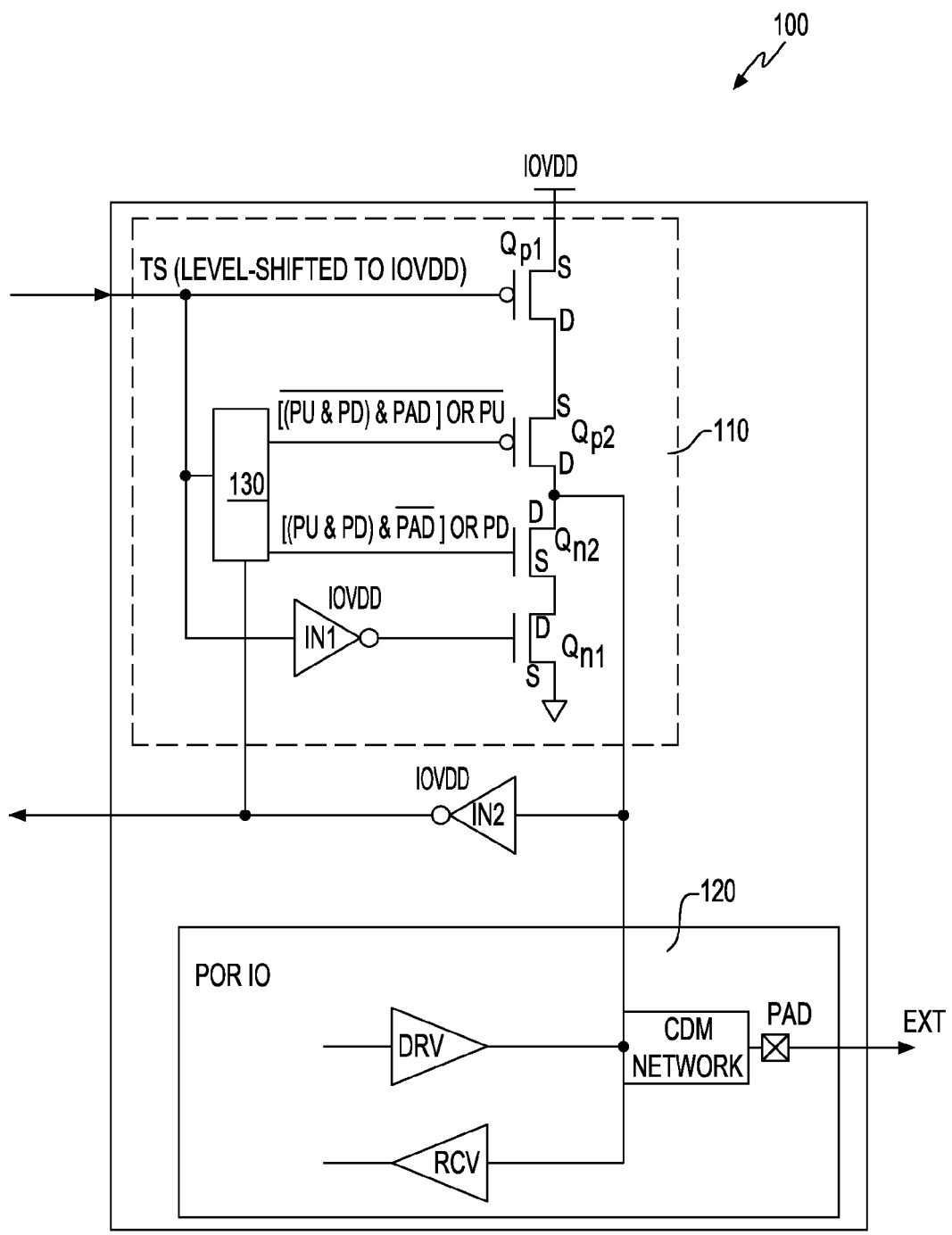
FIG. 1 is a circuit diagram of a portion of an I/O bus buffer drive circuitry that includes one embodiment of a bus keeper and logical circuit of the invention.

FIG. 1 is a circuit diagram of a portion of an I/O bus buffer drive receiver side circuit that includes one embodiment of a bus keeper and logical circuit 110 of the invention. Circuit portion 100 includes an I/O driver/receiver block 120 with a driver circuit DRV and receive circuit RCV by which communication is carried out between the I/O bus buffer drive circuit and a driver output pad for receiving data onto an external bus. The driver output pad state is controlled by a PAD signal (see below) to control its impedance state at the (tri-state system bus) in the presence of a driver tri-state control signal (TS). That is, the TS signal is asserted to disable the driver circuit and enable the bus keeper and control logic circuit or function. Put another way, ICP is included in the inventive operation in order to control the keeper circuit. The function provides for selectable output impedance states at the driver output port, keeps the state, and uses the state to prevent erroneous switching in the receiver side circuitry.

Bus keeper and logic control block 110 receives the TS signal. TS is provided to an inverter circuit In1 and a gate of a first transistor, p-channel transistor Qp1. The inverter output is electrically connected to a gate of a fourth transistor, n-channel CMOS transistor Qn1. First and fourth Transistors Qp1 and Qn1 are enabled or disabled by the bus keeper and logic control function to determine their presence at the driver output pad or node, dependent on the state of TS. The drain of transistor Qp1 is connected to a source of a second transistor, p-channel transistor Qp2, the drain of which is connected to the drain of a third transistor, n-channel transistor Qn2, to the driver and receiver circuits (DRV and RCV) in block 120, and the driver output pad at the bus. The state at the common drains of the second and third transistors is defined in a signal PAD. PAD also drives an inverter In2, which provides an inverted version of PAD for IC and use by a logic controller 120. That is, the logic controller receives the TS, PAD, PU (pull-up) and PD (pull-down) state signals.

In response to controlling the state of TS, PAD, PU and PD, the set of four transistors is controlled to provide a bus state keeping function to "keep" the last driver logical state presented by the bus at tri-state switching, and the selective use of novel pull-up and pull-down control to maintain a proper impedance and therefore logical voltage state with respect to an attached bus line. While pull-up and pull-down devices of the sort are normally found in I/O buffer driver circuits to control switching slew rates and the like, the pull-up and pull-down devices are maintained separately from the driver circuits, such as shown by example in block 120. When disabled by the TS signal, the bus keeper and control logic block selectively operates the pull-up and pull-down devices, but to do so requires that the IC or logic control 130 generate two control signals (those labeled PU & PD).

The PD signal generates 75 KOhms when second transistor Qp2 is active and PAD=0 V. The PU signal generates 75 KOhms when the third transistor Qn2 is active and PAD=IoV$_{dd}$. By incorporating the TS signal (the driver tri-state control signal) into the logic controller 130, the bus keeper and logic control block will be disabled when the driver is enabled (the circuit is active only when the driver is inactive). The following truth table, Table 1, describes the logical operation of the keeper circuit and logic control block 110 when the tri-state signal TS is asserted.

TRUTH TABLE 1

| A | TS | PU* | PD* | PAD | Comments |
|---|----|-----|-----|-----|----------|
| — | 0  | 0   | 0   | Hi-Z | Tri-state mode |
| — | 0  | 1   | 0   | Pull-up | Pull up mode |
| — | 0  | 0   | 1   | Pull-down | Pull down mode |
| — | 0  | 1   | 1   | PAD | Bus keep mode |
| — | 1  | —   | —   | A   | Functional mode |

The table entries at table lines 2, 3, & 4 represent logical states of signals TS, PU, PD, and the resulting state of the signal PAD, provided at the driver output, in accord with logic controller operation upon the signals. Transistors Qp2 and Qn2 are chosen with different or poor drive characteristics, as compared to the drive characteristics of other transistors comprising the bus keeper and logical control circuit. Preferably, the middle transistors comprising the set of four transistors should have different operating characteristics from the transistors comprising the inverters, the driver circuitry, the outer transistors, etc., and display a relatively high source/drain resistance when switched to their "on" state. The bus keeper and logic control block allows use of the pull-up and pull-down devices separately to drive the PAD output to any of four (4) different modes of operation: Hi-Z or tri-state, pull-up, pull-down and bus keep.

Figure 2:
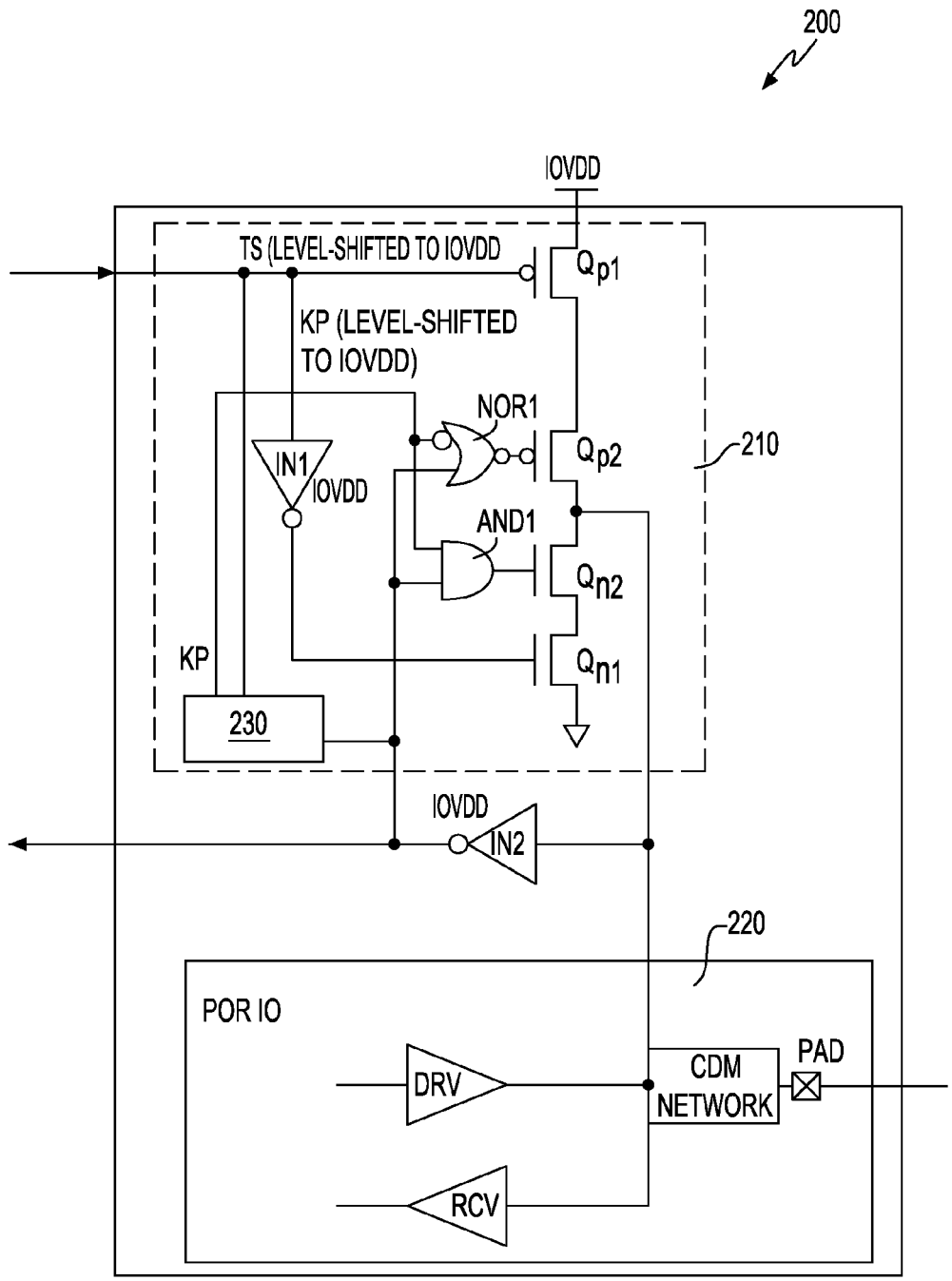
FIG. 2 is a circuit diagram of a portion of a I/O bus buffer drive circuitry that includes an alternative embodiment to the bus keeper and logical circuit depicted in FIG. 1.

A second circuit embodiment of a portion of an I/O bus buffer drive circuit 200 including an alternative bus keeper and logical circuit 210 is shown in FIG. 2 to include an I/O driver/receiver block 220, comprising driver circuit DRV and receive circuit RCV. The driver circuit or driver (DRV) is connected at a driver output node (or pad) to the bus and when enabled. The state of the driver output node and the bus data state switch during driver enabled circuit operation, for example to provide data from the bus to the receiver side circuitry. Circuit 210 and I/O bus buffer drive circuit 200 are controlled by a driver disable signal (TS). Ts must be asserted to disable the driver in circuit 220, and enable the bus keeper and control logic function 210.

Bus keeper and logic control block 210 includes an inverter In1 to present the driver tri-state control signal TS in its logical compliment state to control gate of a transistor (Qn1) in a set for four (4) transistors, Qp1, Qp2, Qn2 and Qn1, connected by respective conductive paths as a keeper block. TS is directly connected to the first transistor, and channel CMOS transistor Qp1. The source of transistor Qp1 is connected to $V_{dd}$, and its drain is connected to the source of transistor Qp2. The drain of Qp2 is connected to the drain of Qn2, the driver and receiver circuits (DRV and RCV) in block 220 and to the bus at the driver output pad. The state of the bus at the driver output pad is kept in signal PAD. The drain of transistor Qn1 connects to the source of transistor Qn2, and the source of transistor Qn1 connects to circuit ground, or the second logical voltage level source.

The gates of Qp2 and Qn2 are respectively controlled by logic controller 230 through a logical element Nor1, and a logical element And1, respectively. That is, the inverted output of inverter In2 is connected to both an And1 input, and a Nor1 non-inverting input. A KP signal is generated at the logic controller (or receiver side circuit) and its uses replaces a need for the circuit 210 to include signals PU and PD (FIG. 1 operation). The KP signal is directly connected to an inverting Nor1 input and second And1 input, at the logic controller 230. The drain outputs of CMOS inverter pair Qp2 and Qn2 control defines the state of the driver output node and bus electrically connected thereto. The state of the bus is kept as a PAD signal controls receiver side operation at the bus, and is fed back to a second inverter In2 to provide an inverted version of PAD, or PAD*, for various circuit needs.

When the set of four transistors are enabled (at tri-state), CMOS transistors Qp2 and Qn2 are controlled to selectively pull-up or pull-down the bus at tri-state. That is, when included at the driver output pad, only a small amount of current state is required to provide a proper logical state to keep the bus from floating. The inner transistors thereby keep the state of the bus, and are weak enough to be overcome by the transistors in the driver circuit in a case where they are on for a short time when the driver is enabled (taken out of tri-state operation). As such, a receiver operating with the bus using the bus keeper and logic control circuit 210 is kept at its last data state, without unnecessary switching, using the inventive keeper and pull-up and pull-down devices.

While normally found in an I/O buffer circuit to control switching slew rates and the like, the resistive pull-up and pull-down devices are maintained in circuit 210 separately from the driver and receiver circuits, in block 220. As mentioned above, the pull-up and pull-down devices (Qp2 and Qn2) may be controlled together in the present embodiment using a single additional control signal, KP. Control signal KP replaces PU and PD, and causes the inventive circuit to operate in accordance with the following Truth Table 2. The use of IP reduces the number of control signals from two to one, but also removes the selective pull-up-only and pull down-only functions seen in the FIG. 1 circuit embodiment.

TRUTH TABLE 2

| A | TS | KP* | PAD | Comments |
|---|----|-----|-----|----------|
| — | 0  | 0   | Hi-Z | Tri-state mode |
| — | 0  | 1   | PAD | Bus keep mode |
| — | 1  | —   | A   | Functional mode |

TS in the logic controls that the bus keeper and logic control block 210 will not be active when the driver is active, ensuring that the near-end drivers will never have to overcome the keeper devices while it is driving. Truth table 2 entries on table lines 2 & 3 represent logical states of TS and KP which generate the PAD control signal, which PAD signal controls driver output node, and bus line connected thereto, to various tri-state operation. The pull-up and pull-down devices comprising four transistors Qp1, Qn1, Qp2 and Qn2 of block 210 maintain the impedance state, and keep the impedance state. The operation the receiver from switching and consuming power, when driven by the TS, KP and PAD signals as shown. Transistors Qp2 and Qn2 are chosen with different or poor drive characteristics, as compared to the drive characteristics of the other transistors, e.g., transistors comprising the inverters, driver circuitry, etc., and to display a relatively high source/drain resistance when switched to their "on" state. In the FIG. 2 circuit embodiment, the logic provides for driving the driver output to two (2) different states or modes of operation: Hi-Z (tri-state mode), and PAD (bus keep mode).

Figure 3:
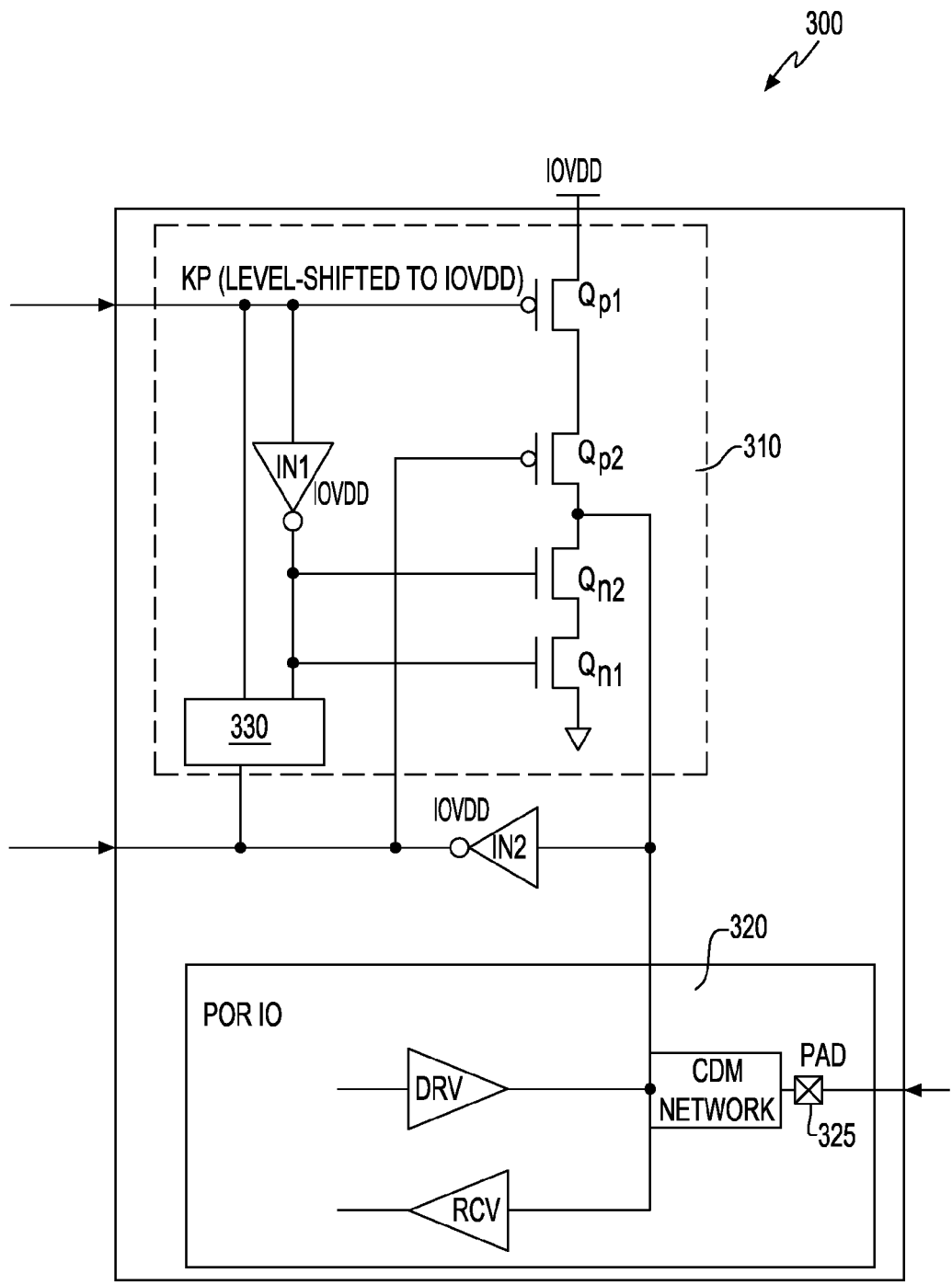
FIG. 3 is a circuit diagram of a portion of an I/O bus buffer drive circuitry that includes an alternative embodiment of the bus keeper and logical circuit depicted in FIGS. 1 and 2.

FIG. 3 depicts another embodiment of a bus keeper and logical circuit 310 of the invention, included in a portion of an I/O bus buffer drive circuit 300, where the keeper and logical circuit 310 is maintained separately from a driver DRV in I/O driver/receiver block 320. Block 320 also includes a receiver circuit RCV. The driver connects to the bus through a driver output port. The state of the bus and driver output port is maintained and kept by the bus keeper and logic controller 310, the state represented by a signal PAD. The I/O bus buffer drive circuit 300 and bus keeper and logic controller 310 may control the bus only in an absence of a t-state control signal. In the presence of the tri-sate signal (TS), the driver circuit DRV is disabled and the bus keeper and control logic function is enabled.

Bus keeper and logic control block 310 includes an inverter circuit In1 to receive and invert the TS signal to its logical state compliment. TS and TS* signals are therefore provided respectively at gates of a first transistor, CMOS n-channel transistor Qn1, and a fourth CMOS p-channel transistor Qp1.

Transistors Qp1 and Qn1 are enabled or disabled by the state of TS, and as such provide, with CMOS transistors Qp2 and Qn2, novel pull-up and pull-down control to keep the last known data state at the bus when the driver is tri-stated. While normally found in an I/O buffer circuit to control switching slew rates and the like, the pull-up and pull-down devices of the inventive bus keeper and logic control block 310 are maintained separately from and in addition to the driver and receiver circuits, in block 320. The source of Qp1 is connected to $V_{dd}$, and its drain is connected to the source of a second transistor, CMOS n-channel transistor Qp2. The drain of Qp2 is connected to the drain of a third transistor, a CMOS p-channel transistor Qn2, to the driver and receiver circuits (DRV and RCV) in block 320, and via the driver output pad to the bus. The drain of Qn1 connects to the source of transistor Qn2, and the source of transistor Qn1 connects to circuit ground. The gates of Qp2 and Qn2 are respectively controlled directly, as distinguished from FIG. 2 circuit 200 operations, by the inverted output of In2. That is, the inverted output of inverter In2 is present at the gates of Qp2 and Qn2, where the drains of Qp2 and Qn2, define PAD with small currents in their respective conductive paths. Pad also drives an inverter In2, which provides an inverted version of PAD, or PAD*, for other circuit functions.

When enabled by the KP signal, the bus keeper and control logic block 310 operate the pull-up and pull-down devices in a manner similar to the operation described for the FIGS. 1 and 2, but with-out selective control signals PU, PD, and the logical And and Nor elements. In the FIG. 3 embodiment, pull-up and pull-down device operation is controlled as wired, and in accord with the following truth table, Truth Table 3.

TRUTH TABLE 3

| A | TS | KP* | PAD | Comments |
|---|----|----|-----|----------|
| — | 0  | 0  | Hi-Z | Tri-state mode |
| — | 0  | 1  | PAD  | Bus keep mode |
| — | 1  | —  | A    | Functional mode |

In this embodiment, signal interaction directly with the TS signal (the system signal) is not required for proper logical circuit operation. The bus keeper and logic controller circuit 310 as shown obviates the need for the TS, PU and PD signals. Operation of the bus keeper and logic control block of circuit 300 is enabled/disabled strictly by the KP signal. Accordingly, when KP is controlled to a logical "0" at the same time that TS is asserted (TS=0), the driver output state PAD is switched to the bus keep state, and if KP=1, the output is put into a tri-state mode. Because of the weak character of the pull-up and pull-down devices in the circuit 310, the driver circuitry can overcome the devices if necessary, when switched on when TS=1, even while the devices remain on, i.e., to overcome" the keeper circuit.

It will be recognized that there are many variations possible to implement the inventions in hardware within an IC or SOC in order to control unwanted receiver switching at tri-state. Consequently, the examples listed above are illustrative, and not meant to be exhaustive.

What is claimed is:

1. A bus keeper and logic controller circuit for operation with a separate receiver-side I/O that includes a driver and/or receiver, wherein the driver is connected to a bus through a driver output node, the logical state of which is kept in a signal PAD to control driver impedance state at the output node to one of a high-impedance (Hi-Z) driver tri-state, a bus-keep state, a pull-up state and a pull-down state, in the presence of a driver tri-state control signal TS, the bus keeper and logic controller circuit further comprising:
    a tri-state control port for receiving the tri-state control signal (TS);
    a logic controller connected to the tri-state control port;
    a first inverter having its input electrically connected to the tri-state control port and to the logic controller;
    a second inverter having its input electrically connected to the driver output pad (PAD) and having its inverting output connected to the receiver and a logic controller input; and
    a keeper circuit block connected to the tri-state control port, the logic controller, the first and second inverters and the driver output node to switch PAD in the presence of TS.

2. The bus keeper and logic control circuit as set forth in claim 1, wherein the keeper circuit block comprises:
    a first, a second, a third and a fourth transistor;
    wherein the first transistor is connected at a first end of its conduction path to a first bias voltage, and at a second end of its conduction path to a first end of a conduction path of the second transistor, a second end of the second transistor's conduction path connects to a second end of the third transistor's conduction path, a first end of the third transistor's conduction path connects to a second end of the fourth transistor's conduction path, wherein a first end of the fourth transistor's conduction path connects to a second bias voltage; and
    wherein the second ends of the second and third transistors are further connected to the driver output node to define one of said output node states.

3. The bus keeper and logic control circuit as set forth in claim 2, wherein the second and third transistors are CMOS field effect transistors of first and second conductivity types.

4. The bus keeper and logic control circuit as set forth in claim 1, wherein the keeper circuit block controls and keeps one of the PU state and PD state in accord with the following logical statements, respectively:
    [TS*&([(PU&PD)&PAD] or PU)*];
    [TS*&([(PU&PD)&PAD*] or PD)].

5. The bus keeper and logic control circuit as set forth in claim 1, wherein the first and second inverters are included in the logic controller.

6. The bus keeper and logic control circuit as set forth in claim 2, wherein the logical controller includes a logical Nor element and a logical AND element, and asserts PAD* at an AND element input, and at a non-inverting NOR element input, asserts a signal KP at a second AND input and at an inverting input of the Nor element, and wherein the Nor and AND element outputs are connected to the respective gates of the second and third transistors.

7. The bus keeper and logic control circuit as set forth in claim 6, wherein the signal PAD controls the driver output impedance to one of two states only: Tri-State and Bus-Keep state, using only TS, KP and PAD.

8. The bus keeper and logic control circuit as set forth in claim 6, wherein the KP signal is generated in the logic controller and electrically asserted directly at the gate of the first transistor, and through the first inverter to the gate of the fourth transistor, wherein PAD* is asserted directly at the gates of the second and third transistors.

9. A receiver circuit including separate I/O drive circuitry that includes a driver and receiver, the driver electrically connected at a driver output node to an external bus line, and a bus keeper and logic control circuit as set forth in claim 1, for controlling and keeping a state (PAD) of the output driver at the bus controls to one of a high-impedance (Hi-Z) tri-state, a bus-keep state, a pull-up state and a pull-down state, when in the presence of driver tri-state control signal TS.

10. The receiver circuit as set forth in claim 9, wherein the keeper circuit block comprises a first, a second, a third and a fourth transistor;
    wherein the first transistor is connected at a first end of its conduction path to a first bias voltage, and at a second end of its conduction path to a first end of a conduction path of the second transistor, a second end of the second transistor's conduction path connects to a second end of the third transistor's conduction path, a first end of the third transistor's conduction path connects to a second end of the fourth transistor's conduction path, wherein a first end of the fourth transistor's conduction path connects to a second bias voltage; and
    wherein the second ends of the second and third transistors are connected to the driver output node to define said output node states.

11. The receiver circuit as set forth in claim 10, wherein the second and third transistors are CMOS field effect transistors of first and second conductivity types, respectively.

12. The receiver circuit as set forth in claim 10, wherein the second and third transistors are controlled as pull-up (PU) or pull-down (PD) devices based on the following logical state relationships, respectively:
    [TS*&([(PU&PD)&PAD] or PU)*];
    [TS*&([(PU&PD)&PAD*] or PD)].

13. The receiver circuit as set forth in claim 9, wherein the first and second inverters are included in the logic controller circuit.

14. The receiver circuit as set forth in claim 10, wherein the logical controller includes a logical Nor element and a logical AND element, asserts PAD* at an AND element input and a non-inverting input NOR input, asserts a signal KP at a second AND input and an inverting Nor input, and wherein respective Nor and AND element output signals are provided at the gates of the second and third transistors.

15. The receiver circuit as set forth in claim 14, wherein PAD controls the driver output impedance to one of two states: Tri-State and Bus-Keep, using only TS, KP and PAD.

16. The receiver circuit as set forth in claim 10, wherein KP is generated in the logic controller and provided directly to the gate of the first transistor, through the first inverter to the gate of the fourth transistor, and PAD* is provided directly at the gates of the second and third transistors, and wherein TS and KP logically define one of the high impedance tri-state and the bus keep state at the driver output bus connection.

* * * * *